United States Patent [19]
Staudinger et al.

[11] Patent Number: 6,049,703
[45] Date of Patent: Apr. 11, 2000

[54] AMPLIFIER CIRCUIT AND METHOD FOR INCREASING LINEARITY OF THE AMPLIFIER CIRCUIT

[75] Inventors: Joseph Staudinger, Gilbert; Richard E. Sherman, Mesa, both of Ariz.

[73] Assignee: Motorola, Inc., Schaumburg, Ill.

[21] Appl. No.: 08/980,220

[22] Filed: Nov. 28, 1997

[51] Int. Cl.[7] .............. H04B 1/04; G01R 12/00; H03F 3/38; H03F 1/26

[52] U.S. Cl. .................. 455/114; 330/2; 330/10; 330/149; 330/285

[58] Field of Search .............. 330/2, 139, 135, 330/136, 279, 285, 277, 297, 10, 149, 151; 455/115, 246.1, 65, 303, 306; 375/281, 343

[56] References Cited

U.S. PATENT DOCUMENTS

| | | | |
|---|---|---|---|
| 3,605,018 | 9/1971 | Coviello . | |
| 3,643,170 | 2/1972 | Stanger | 328/163 |
| 4,194,154 | 3/1980 | Kahn | 455/114 |
| 4,337,438 | 6/1982 | Guggenbuhl et al. | 330/10 |
| 4,574,248 | 3/1986 | Snodgrass | 330/2 |
| 4,831,334 | 5/1989 | Hudspeth et al. | 330/10 |
| 5,249,201 | 9/1993 | Posner et al. | 375/59 |
| 5,250,912 | 10/1993 | Fujita | 330/285 |
| 5,760,646 | 6/1998 | Belcher et al. | 330/149 |

*Primary Examiner*—William Cumming
*Attorney, Agent, or Firm*—Anthony M. Martinez

[57] ABSTRACT

An amplifier circuit (10) and a method for increasing linearity of the amplifier circuit. The amplifier circuit (10) has a limiter (13) that generates a phase modulated signal (30) in accordance with a phase modulated component (22) of an RF input signal (20). The amplifier circuit (10) also has an envelope detector (16) that generates an envelope signal (40) in accordance with the amplitude modulated component (21) of the RF input signal (20). A delay compensation circuit (17) receives the envelope signal (40) and generates a lead phase envelope signal (50) and an envelope amplifier (18) receives the lead phase envelope signal (50) and generates a bias signal. An RF amplifier (14) amplifies the phase modulated signal (30) in accordance with the bias signal.

13 Claims, 4 Drawing Sheets

AMPLIFIER CIRCUIT AND METHOD FOR INCREASING LINEARITY OF THE AMPLIFIER CIRCUIT

BACKGROUND OF THE INVENTION

The present invention relates, in general, to amplifiers and, more particularly, to power amplifier circuits.

Portable communication devices include cellular phones and two-way radios. An important component of these devices is the power amplifier circuit. Performance parameters of the power amplifier circuit include linearity and efficiency. The linearity of the power amplifier circuit affects the quality of a signal transmitted by the portable communication device. The efficiency of a power amplifier circuit affects battery life, size, and weight of the portable communication device. Thus, it is desirable for a power amplifier circuit used in these devices to have a large linear range of operation. However, power amplifier circuits having a large linear range of operation are inherently inefficient.

Accordingly, it would be advantageous to have a power amplifier circuit that is both linear and efficient. It would be of further advantage for the power amplifier circuit to be area and cost efficient.

BRIEF SUMMARY OF THE INVENTION

The present invention provides an Envelope Elimination and Restoration (EER) amplifier for amplifying a Radio Frequency (RF) signal having a phase modulated component and an amplitude modulated component. The EER amplifier includes a RF amplifier, an envelope detector, a delay compensation circuit, and an envelope amplifier.

DETAILED DESCRIPTION OF THE DRAWINGS

Generally, the present invention provides an amplifier circuit and a method for improving the linearity of the amplifier circuit. More particularly, the present invention uses a technique known as Envelope Elimination and Restoration (EER) to provide an efficient and linear amplifier circuit. A typical EER amplifier circuit amplifies an RF signal by separately amplifying the phase modulated component and the amplitude modulated component of the RF signal. A disadvantage with a typical EER amplifier circuit is the time delay associated with amplifying the amplitude modulated component of the RF signal because it can adversely affect the linearity of the amplified output signal. In accordance with the present invention, a delay compensation circuit is coupled to an EER amplifier circuit to provide an improved EER amplifier circuit. The improved EER amplifier circuit has greater linearity and less distortion than a typical EER amplifier circuit.

Figure 1:
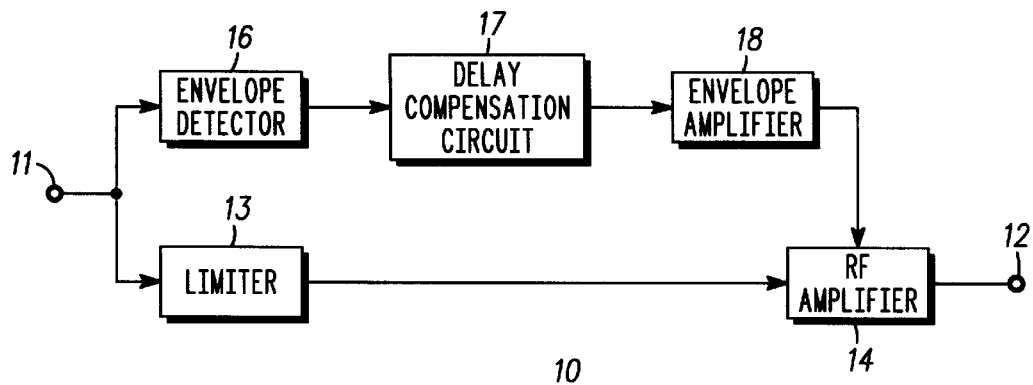
FIG. 1 is a block diagram of an amplifier in accordance with the present invention.

FIG. 1 is a block diagram of an amplifier circuit 10 having an input terminal 11 and an output terminal 12 in accordance with the present invention. Amplifier circuit 10 has two paths for amplifying a Radio Frequency (RF) input signal. The first path of amplifier circuit 10 includes a limiter 13 and an RF amplifier 14. The second path of amplifier circuit 10 includes an envelope detector 16, a delay compensation circuit 17, and an envelope amplifier 18. The input of limiter 13 is connected to input terminal 11 and the output of limiter 13 is connected to the RF input of RF amplifier 14. The output of RF amplifier 14 is connected to output terminal 12. The input of envelope detector 16 is connected to input terminal 11 and the output of envelope detector 16 is connected to the input of a delay compensation circuit 17. The input of envelope amplifier 18 is connected to the output of delay compensation circuit 17 and the output of envelope amplifier 18 is connected to the bias input of RF amplifier 14.

The operation of amplifier circuit 10 will be described with reference to FIGS. 1–6. In operation, input terminal 11 is coupled for receiving an RF input signal such as RF input signal 20 illustrated in FIG. 2.

Figure 2:
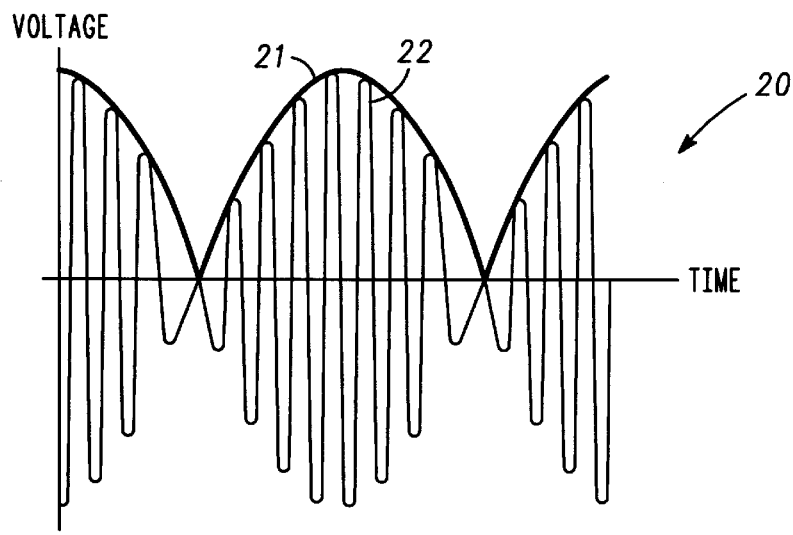
FIG. 2 illustrates an amplitude modulated time-varying sinusoidal signal.

Briefly referring to FIG. 2, RF input signal 20 is an amplitude modulated time-varying sinusoidal signal having an amplitude modulated component 21 and a phase modulated component 22. Amplitude modulated component 21 of RF input signal 20 is also referred to as an envelope of RF input signal 20.

Figure 3:
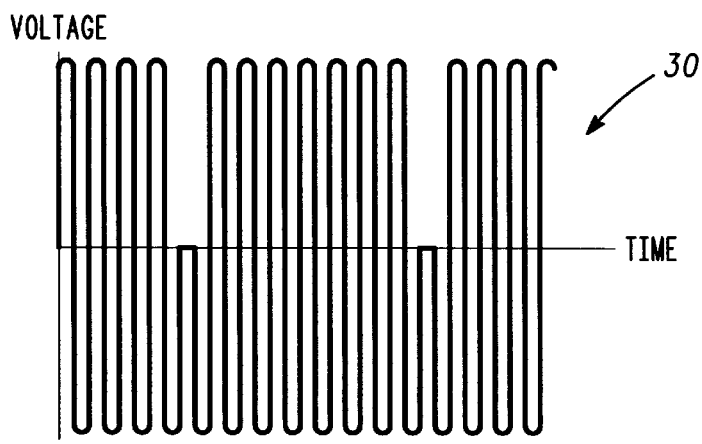
FIG. 3 illustrates a phase modulated signal.

Referring to FIGS. 1–3, the input of limiter 13 receives RF input signal 20 via input terminal 11. Limiter 13 removes amplitude modulated component 21 from RF input signal 20 and generates a phase modulated signal 30 (FIG. 3) in accordance with phase modulated component 22 of RF input signal 20. Phase modulated signal 30 is transmitted to the RF input of RF amplifier 14 from the output of limiter 13.

The input of envelope detector 16 receives RF input signal 20 via input terminal 11. Envelope detector 16 removes phase modulated component 22 from RF input signal 20 and generates an envelope signal 40 (FIG. 4) in accordance with amplitude modulated component 21 of RF input signal 20.

Figure 4:
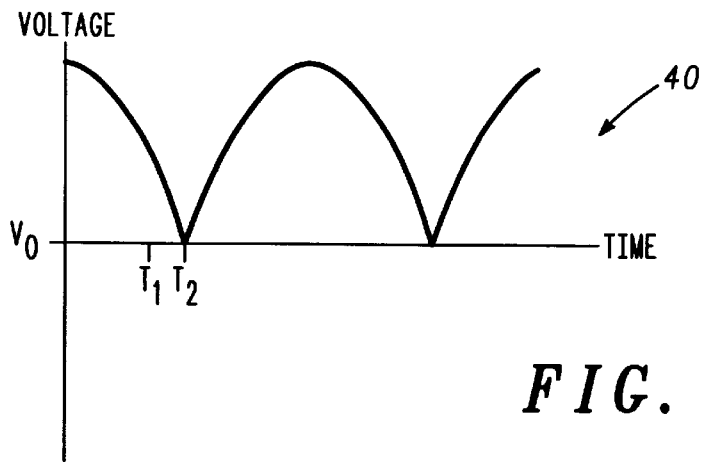
FIG. 4 illustrates an envelope signal.

Briefly referring to FIG. 4, envelope signal 40 contains amplitude modulated component 21 of RF input signal 20 but not phase modulated component 22. Envelope signal 40 has an amplitude and a phase. T1 and T2 denote time along the TIME axis. Vo denotes a voltage value along the VOLTAGE axis. At time T2, the amplitude of envelope signal 40 has a voltage value of Vo.

Envelope signal 40 is transmitted to the input of delay compensation circuit 17 from the output of envelope detector 16. Delay compensation circuit 17 advances or increases the phase of envelope signal 40 with respect to time, generating a lead phase envelope signal 50 illustrated in FIG. 5.

Figure 5:
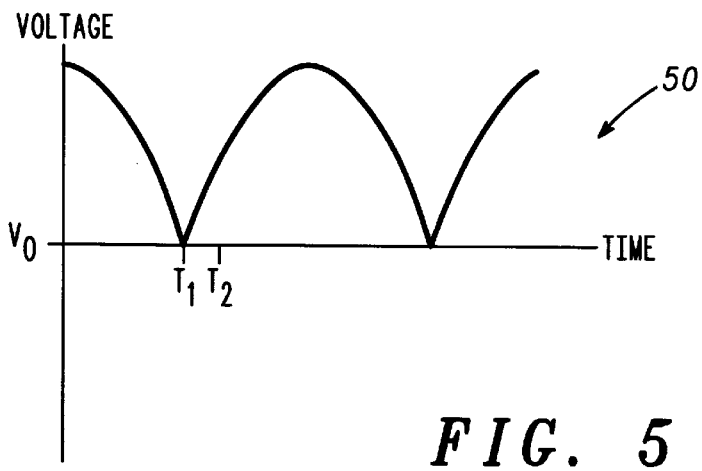
FIG. 5 illustrates a lead envelope phase signal.
Figure 6:
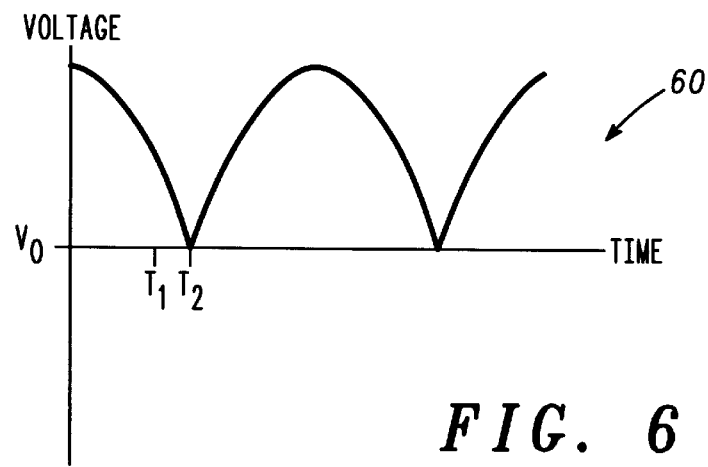
FIG. 6 illustrates an amplified envelope signal.

Briefly referring to FIG. 5, lead phase envelope signal 50 has a phase and an amplitude. Lead phase envelope signal 50 is similar to envelope signal 40 (FIG. 4) except that the phase of lead phase envelope signal 50 is increased or shifted with respect to time compared to the phase of envelope signal 40. This is illustrated by referring to FIGS. 4 and 5 and noting that the amplitude of lead phase envelope signal 50 has a voltage value of Vo at time T1. Because time T1 occurs before time T2, lead phase envelope signal 50 has a leading phase compared to envelope signal 40.

Lead phase envelope signal 50 is transmitted to the input of envelope amplifier 18. Envelope amplifier 18 amplifies the amplitude of lead phase envelope signal 50 and delays or decreases the phase of lead phase envelope signal 50 with respect to time, generating an amplified envelope signal 60 illustrated in FIG. 6. Briefly referring to FIG. 6, amplified envelope signal 60 has a phase and an amplitude. Amplified envelope signal 60 is similar to envelope signal 40 (FIG. 4) in that the amplitude of amplified envelope signal 60 has a voltage value of Vo at time T2. Amplified envelope signal 60 has a lagging phase compared to lead phase envelope signal 50 (FIG. 5). Amplified envelope signal 60 is also referred to as a bias signal.

Referring to FIGS. 1–6, envelope amplifier 18 introduces the phase delay of lead phase envelope signal 50 and delay compensation circuit 17 introduces a phase increase of envelope signal 40. Preferably, the phase delay of lead phase envelope signal 50 is approximately equal to the phase increase of envelope signal 40. Therefore, amplified envelope signal 60 will not have a phase shift or time delay with respect to envelope signal 40. In accordance with the present invention, the time delay associated with the phase lagging characteristic of envelope amplifier 18 is compensated for by the phase leading characteristic introduced by delay compensation circuit 17. Preferably, the amplitude of amplified envelope signal 60 is greater than the amplitude of envelope signal 40. Amplified envelope signal 60 is transmitted to the bias input of RF amplifier 14 from the output of envelope amplifier 18. Amplified envelope signal 60 provides a modulated power supply signal to the bias input of RF amplifier 14 that is proportional to amplitude modulated component 21 of RF input signal 20. RF amplifier 14 amplifies phase modulated signal 30 in accordance with amplified envelope signal 60 and generates an amplified RF signal having envelope and phase modulated components. The amplified RF signal is similar to RF input signal 20 except that the amplitude of the envelope of the amplified RF signal is greater than the amplitude of envelope 21 of RF input signal 20. The amplified RF signal is transmitted to output terminal 12 from the output of RF amplifier 14. Since phase modulated signal 30 is a signal without a time-varying amplitude, RF amplifier 14 can be a highly efficient amplifier such as, for example, a class A/B amplifier. The linearity of amplifier circuit 10 is greater than a typical EER amplifier circuit because delay compensation circuit 17 compensates the time delay of envelope amplifier 18.

It should be noted that including limiter 13 is not a limitation of the present invention. Amplifier circuit 10 can be manufactured without limiter 13.

Figure 7:
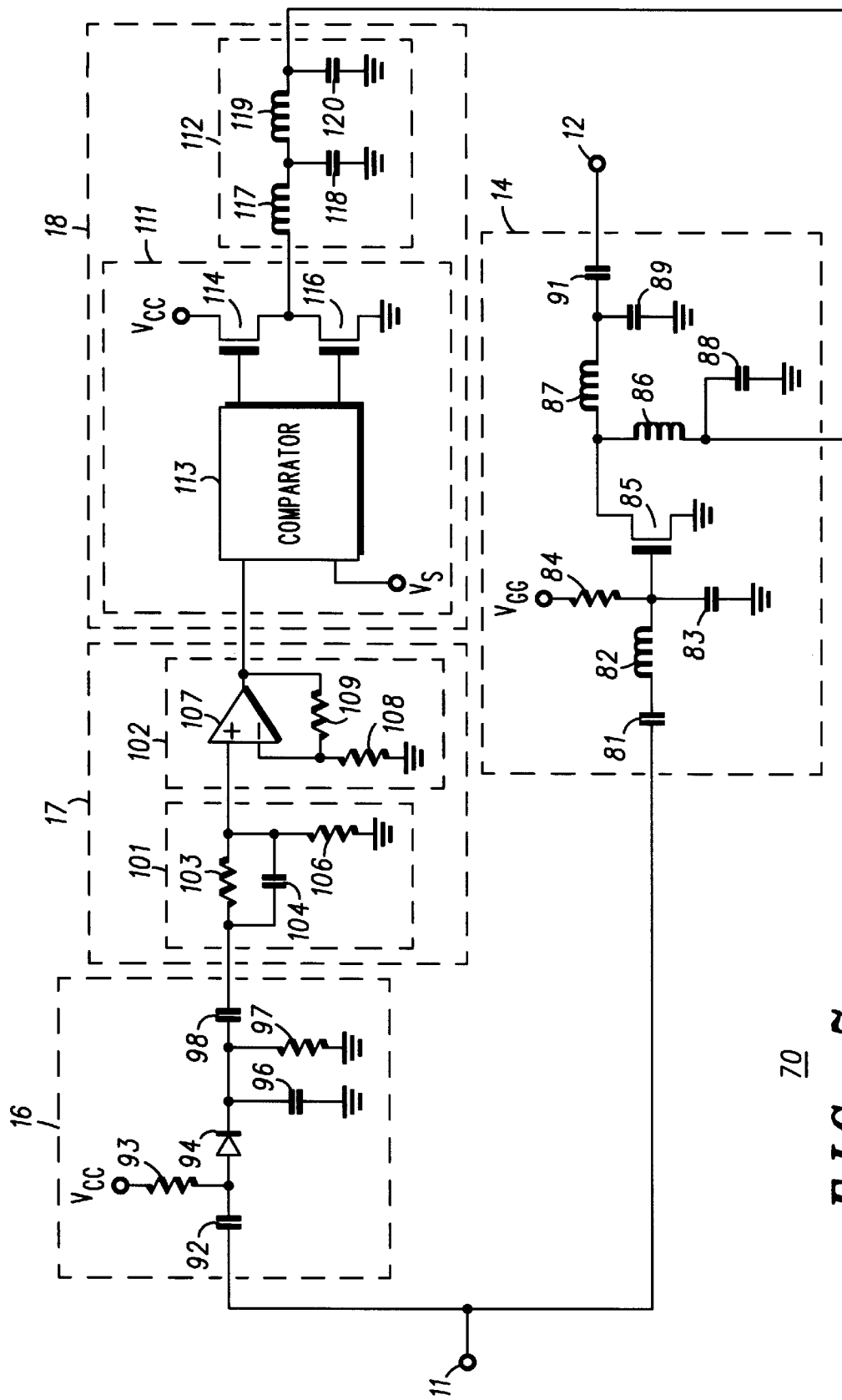
FIG. 7 is a schematic diagram of an amplifier circuit in accordance with an embodiment of the present invention.

FIG. 7 is a schematic diagram of an amplifier circuit 70 in accordance with an embodiment of the present invention. Amplifier circuit 70 includes RF amplifier 14, envelope detector 16, delay compensation circuit 17, and envelope amplifier 18.

By way of example, RF amplifier 14 includes capacitors 81, 83, 88, 89, and 91, inductors 82, 86, and 87, a resistor 84, and a Field Effect Transistor (FET) 85. The first terminal of capacitor 81 is connected to the RF input of RF amplifier 14 and the second terminal of capacitor 81 is connected to the first terminal of inductor 82. The second terminal of inductor 82 is commonly connected to the first terminal of capacitor 83, the first terminal of resistor 84, and the gate of FET 85. The second terminal of capacitor 83 is coupled for receiving a power supply voltage such as, for example, ground. The second terminal of resistor 84 is coupled for receiving a power supply voltage such as, for example, Vgg. The drain of FET 85 is commonly connected to the first terminal of inductor 86 and the first terminal of inductor 87. The source of FET 85 is coupled for receiving a power supply voltage such as, for example, ground. The second terminal of inductor 86 is commonly connected to the bias input of RF amplifier 14 and the first terminal of capacitor 88. The second terminal of capacitor 88 is coupled for receiving a power supply voltage such as, for example, ground. The second terminal of inductor 87 is commonly connected to the first terminal of capacitor 89 and the first terminal of capacitor 91. The second terminal of capacitor 91 is connected to the output of RF amplifier 14 and the second terminal of capacitor 89 is coupled for receiving a power supply voltage such as, for example, ground. Although transistor 85 is shown as a FET, this is not a limitation of the present invention. For example, transistor 85 can be a bipolar transistor. It should be noted that the gate of a FET is referred to as a control electrode and the drain and source of a FET are referred to as current carrying electrodes. Likewise, the base of a bipolar transistor is referred to as the control electrode and the collector and emitter electrodes of the bipolar transistor are referred to as current carrying electrodes.

Envelope detector 16 includes capacitors 92, 96, and 98, resistors 93 and 97, and a diode 94. The first terminal of capacitor 92 is connected to the input of envelope detector 16 and the second terminal of capacitor 92 is commonly connected to the first terminal of resistor 93 and the anode of diode 94. The second terminal of resistor 93 is coupled for receiving a power supply voltage such as, for example, Vcc. The cathode of diode 94 is commonly connected to the first terminal of capacitor 96, the first terminal of resistor 97, and the first terminal of capacitor 98. The second terminal of capacitor 96 and the second terminal of resistor 97 are coupled for receiving a power supply voltage such as, for example, ground. The second terminal of capacitor 98 is connected to the output of envelope detector 16.

Delay compensation circuit 17 is comprised of a phase compensation circuit 101 and a gain stage 102. Phase compensation circuit 101 is comprised of resistors 103 and 106 and a capacitor 104. Gain stage 102 is comprised of an operational amplifier 107 and resistors 108 and 109. The input of phase compensation circuit 101 is connected to the input of delay compensation circuit 17 and the output of phase compensation circuit 101 is connected to the input of gain stage 102. The output of gain stage 102 is connected to the output of delay compensation circuit 17. The first terminal of resistor 103 and the first terminal of capacitor 104 are commonly connected to the input of phase compensation circuit 101. The second terminal of resistor 103 is commonly connected to the second terminal of capacitor 104, the first terminal of resistor 106, and the output of phase compensation circuit 101. The second terminal of resistor 106 is coupled for receiving a power supply voltage such as, for example, ground. The non-inverting input of operational amplifier 107 is connected to the input of gain stage 102 and the output of operational amplifier 107 is connected to the output of gain stage 102. The inverting input of operational amplifier 107 is commonly connected to the first terminal of resistor 108 and the first terminal of resistor 109. The second terminal of resistor 109 is connected to the output of operational amplifier 107 and the second terminal of resistor 108 is coupled for receiving a power supply voltage such as, for example, ground.

Envelope amplifier 18 is comprised of a pulse width modulator 111 and a filter 112. Pulse width modulator 111 is comprised of a comparator 113 and transistors 114 and 116. Filter 112 is a four-pole low-pass filter and includes inductors 117 and 119 and capacitors 118 and 120. The input of pulse width modulator 111 is connected to the input of envelope amplifier 18 and the output of pulse width modulator 111 is connected to the input of filter 112. The output of filter 112 is connected to the output of envelope amplifier 18. The input of pulse width modulator 111 is connected to the comparison input of comparator 113. The reference input of comparator 113 is coupled for receiving a power supply voltage such as, for example, a sampling voltage Vs. Transistor 114 is a P-channel FET and transistor 116 is an N-channel FET, each having a gate, a drain, and a source. The gate of FET 114 is connected to the first output of comparator 113 and the source of FET 114 is coupled for receiving a power supply voltage such as, for example, Vcc. The gate of FET 116 is connected to the second output of comparator 113 and the source of FET 116 is coupled for receiving a power supply voltage such as, for example, ground. The drain of FET 114 is commonly connected to the drain of FET 116 and the output of pulse width modulator 111. The first terminal of inductor 117 is connected to the input of filter 112. The second terminal of inductor 117 is commonly connected to the first terminal of capacitor 118 and the first terminal of inductor 119. The second terminal of inductor 119 is commonly connected to the first terminal of capacitor 120 and the output of filter 112. The second terminal of capacitor 118 and the second terminal of capacitor 120 are coupled for receiving a power supply voltage such as, for example, ground.

In operation, phase compensation circuit 101 receives an envelope signal such as, for example, envelope signal 40 of FIG. 4 and increases the phase of the envelope signal with respect to time as described hereinbefore. Gain stage 102 recovers signal losses from phase compensation circuit 101. It should be noted that including gain stage 102 is not a limitation of the present invention. The following equations are for the gain response (Av) and phase response (PR) of phase compensation circuit 101.

$$Av = K(1+j(f/fz))/(1+j(f/fp))$$

$$PR = \tan^{-1}(f/fz) - \tan^{-1}(f/fp)$$

$$fz = 1/(2\pi * R_{103} * C_{104})$$

$$fp = (1 + R_{103}/R_{106})/(2\pi * R_{103} * C_{104})$$

$$K = R_{106}/(R_{103} + R_{106})$$

fz is the zero frequency of phase compensation circuit 101;

fp is the pole frequency of phase compensation circuit 101;

$R_{103}$ is the resistance value of resistor 103;

$R_{106}$ is the resistance value of resistor 106; and $C_{104}$ is the capacitance value of capacitor 104.

A lead phase characteristic for phase compensation circuit 101 is accomplished by designing the zero frequency (fz) of phase compensation circuit 101 to be lower than the pole frequency (fp) of phase compensation circuit 101. Preferably, the phase increase of phase compensation circuit 101 is approximately equal to the phase delay of filter 112. Phase compensation circuit 101 can be placed in series with a similar circuit shown in phase compensation circuit 101 to generate a cascaded network of phase compensation circuits.

The comparison input of pulse width modulator 111 receives a lead phase signal having a time-varying amplitude such as, for example, lead phase envelope signal 50 of FIG. 5 from the output of delay compensation circuit 17. Sampling voltage Vs is a sampling signal such as, for example, a triangle wave signal, and is compared to the amplitude of the lead phase signal appearing at the comparison input of comparator 113. Preferably, the frequency of sampling voltage Vs is greater than the frequency of the lead phase signal. Comparator 113 cooperates with FETs 114 and 116 to generate a pulse width signal having a plurality of pulses. The plurality of pulses of the pulse width signal have pulse widths that may vary with respect to the amplitude of the lead phase signal signal. The pulse width signal is transmitted to the input of filter 112 from the output of pulse width modulator 111. Filter 112 filters the pulse width signal to recover the original envelope of the lead phase signal appearing at the comparison input of comparator 113 and delays the phase of the pulse width signal with respect to time. In addition, filter 112 filters sampling components in the pulse width signal arising from sampling voltage Vs. Pulse width modulator 111 cooperates with filter 112 to provide an efficient circuit for amplifying a signal with a time-varying amplitude. Although filter 112 is described as a four-pole filter, this is not a limitation of the present invention. A filter having any number of poles can be used for filter 112.

Figure 8:
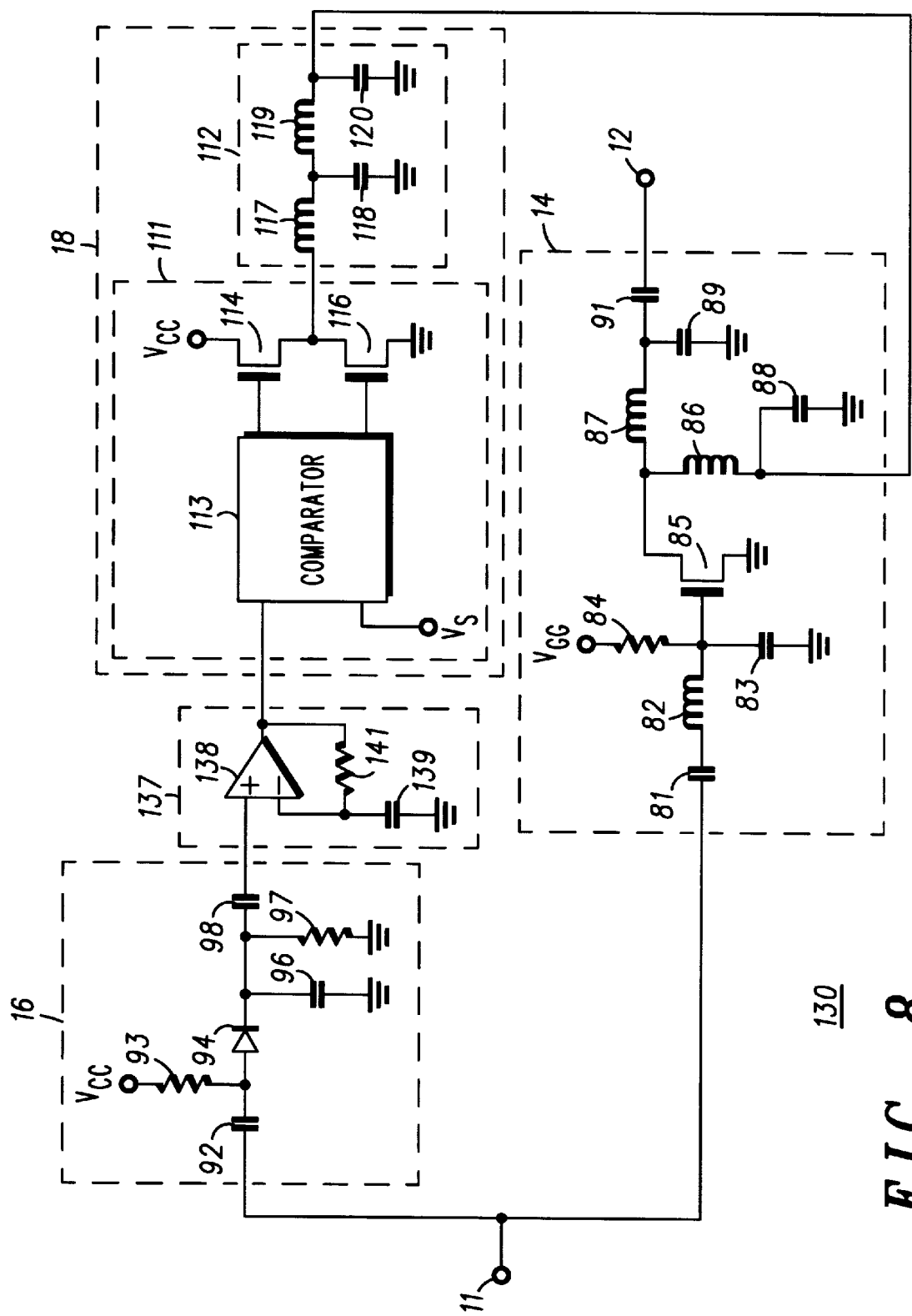
FIG. 8 is a schematic diagram of an amplifier circuit in accordance with another embodiment of the present invention.

FIG. 8 is a schematic diagram of an amplifier circuit 130 in accordance with another embodiment of the present invention. It should be understood that the same reference numerals are used in the figures to denote the same elements. Amplifier circuit 130 includes RF amplifier 14, envelope detector 16, a delay compensation circuit 137, and envelope amplifier 18. Amplifier circuit 130 is similar to amplifier circuit 70 except for the embodiment of delay compensation circuit 137. Delay compensation circuit 137 is comprised of an operational amplifier 138, a capacitor 139, and a resistor 141. The input of delay compensation circuit 137 is connected to the output of envelope detector 16 and the output of delay compensation circuit 137 is connected to the input of envelope amplifier 18. The non-inverting input of operational amplifier 138 is connected to the input of delay compensation circuit 137 and the output of operational amplifier 138 is connected to the output of delay compensation circuit 137. The inverting input is commonly connected to the first terminal of capacitor 139 and the first terminal of resistor 141. The second terminal of resistor 141 is connected to the output of operational amplifier 138 and the second terminal of capacitor 139 is coupled for receiving a power supply voltage.

The operation of delay compensation circuit 137 is similar to the operation of delay compensation circuit 17 of FIG. 7 except that an active circuit is used to increase the phase with respect to time of a signal appearing at the input of delay compensation circuit 137. Preferably, the amount of phase increase of delay compensation circuit 137 is approximately equal to the amount of phase delay of filter 112.

By now it should be appreciated that an amplifier circuit and a method for improving the linearity of the amplifier circuit have been provided. An advantage of the present invention is that it provides an improved EER amplifier circuit than has greater linearity than a typical EER amplifier circuit.

We claim:

1. An amplifier circuit, comprising:
   a Radio Frequency (RF) amplifier having an RF input, a bias input, and an output;
   an envelope detector having an input coupled to the RF input of the RF amplifier and an output;
   a delay compensation circuit having an input coupled to the output of the envelope detector and an output; and an envelope amplifier having an input coupled to the output of the delay compensation circuit and an output coupled to the bias input of the RF amplifier, wherein the envelope amplifier comprises, a pulse width modulator having an input coupled to the input of the envelope amplifier and an output, and a filter having an input coupled to the output of the pulse width modulator and an output coupled to the output of the envelope amplifier, wherein the pulse width modulator comprises:

a comparator having a comparison input coupled to the input of the pulse width modulator, a reference input coupled for receiving a first power supply voltage, a first output, and a second output, a first transistor having a control electrode coupled to the first output of the comparator, a first current carrying electrode coupled for receiving a second power supply voltage, and a second current carrying electrode, and a second transistor having a control electrode coupled to the second output of the comparator, a first current carrying electrode coupled to the second current carrying electrode of the first transistor, and a second current carrying electrode coupled for receiving a third power supply voltage.

2. The amplifier circuit of claim 1, wherein the filter comprises:

a first inductor having a first terminal coupled to the input of the filter and a second terminal;

a first capacitor having a first terminal coupled to the second terminal of the first inductor and a second terminal coupled for receiving a power supply voltage;

a second inductor having a first terminal coupled to the second terminal of the first inductor and a second terminal coupled to the output of the filter; and a second capacitor having a first terminal coupled to the second terminal of the second inductor and a second terminal coupled for receiving the power supply voltage.

3. The amplifier circuit of claim 1, wherein the delay compensation circuit comprises:

a first resistor having a first terminal coupled to the input of the delay compensation circuit and a second terminal coupled to the output of the delay compensation circuit;

a capacitor having a first terminal coupled to the input of the delay compensation circuit and a second terminal coupled to the output of the delay compensation circuit; and a second resistor having a first terminal coupled to the output of the delay compensation circuit and a second terminal coupled for receiving a first power supply voltage.

4. The amplifier circuit of claim 1, wherein the delay compensation circuit comprises:

a first resistor having a first terminal coupled to the input of the delay compensation circuit and a second terminal;

a capacitor having a first terminal coupled to the input of the delay compensation circuit and a second terminal coupled to the second terminal of the first resistor;

a second resistor having a first terminal coupled to the second terminal of the first resistor and a second terminal coupled for receiving a power supply voltage; and a gain stage having an input coupled to the second terminal of the first resistor and an output coupled to the output of the delay compensation circuit.

5. The amplifier circuit of claim 4, wherein the gain stage comprises:

an operational amplifier having a non-inverting input coupled to the input of the gain stage, an inverting input, and an output coupled to the output of the gain stage;

a third resistor having a first terminal coupled to the inverting input of the operational amplifier and a second terminal coupled to the output of the operational amplifier; and a fourth resistor having a first terminal coupled to the inverting input of the operational amplifier and a second terminal coupled for receiving the power supply voltage.

6. The amplifier circuit of claim 1, wherein the delay compensation circuit comprises:

an operational amplifier having a non-inverting input coupled to the input of the delay compensation circuit, an inverting input, and an output coupled to the output of the delay compensation circuit;

a resistor having a first terminal coupled to the inverting input of the operational amplifier and a second terminal coupled to the output of the operational amplifier; and a capacitor having a first terminal coupled to the inverting input of the operational amplifier and a second terminal coupled for receiving a power supply voltage.

7. The amplifier circuit of claim 1, further comprising a limiter, wherein the RF input of the RF amplifier is coupled to the input of the envelope detector via the limiter.

8. The amplifier circuit of claim 1, wherein the envelope detector comprises:

a first capacitor having a first terminal coupled to the input of the envelope detector and a second terminal;

a first resistor having a first terminal coupled to the second terminal of the first capacitor and a second terminal coupled for receiving a first power supply voltage;

a diode having an anode coupled to the second terminal of the first capacitor and a cathode;

a second capacitor having a first terminal coupled to the cathode of the diode and a second terminal coupled for receiving the first power supply voltage;

a second resistor having a first terminal coupled to the cathode of the diode and a second terminal coupled for receiving the first power supply voltage; and a third capacitor having a first terminal coupled to the cathode of the diode and a second terminal coupled to the output of the envelope detector.

9. The amplifier circuit of claim 1, wherein the RF amplifier comprises:

a first capacitor having a first terminal coupled to the RF input of the RF amplifier and a second terminal;

a first inductor having a first terminal coupled to the second terminal of the first capacitor and a second terminal;

a second capacitor having a first terminal coupled to the second terminal of the first inductor and a second terminal coupled for receiving a first power supply voltage;

a resistor having a first terminal coupled to the second terminal of the first inductor and a second terminal coupled for receiving a second power supply voltage;

a transistor having a control electrode coupled to the second terminal of the first inductor, a first current carrying electrode, and a second current carrying electrode coupled for receiving the first power supply voltage;

a second inductor having a first terminal coupled to the first current carrying electrode of the transistor and a second terminal coupled to the bias input of the RF amplifier;

a third capacitor having a first terminal coupled to the bias input of the RF amplifier and a second terminal coupled for receiving the first power supply voltage;

a third inductor having a first terminal coupled to the first current carrying electrode of the transistor and a second terminal;

a fourth capacitor having a first terminal coupled to the second terminal of the third inductor and a second terminal coupled for receiving the first power supply voltage; and a fifth capacitor having a first terminal coupled to the second terminal of the third inductor and a second terminal coupled to the output of the RF amplifier.

10. The amplifier circuit of claim 9, wherein the transistor is a field effect transistor.

11. A method for increasing linearity of an amplifier circuit, comprising the steps of:

receiving an input signal having a phase modulated component and an amplitude modulated component;

generating an envelope signal having a phase in accordance with the amplitude modulated component of the input signal;

generating a phase modulated signal in accordance with the phase modulated component of the input signal;

increasing the phase of the envelope signal to generate a lead phase signal having a phase;

delaying the phase of the lead phase signal to generate a bias signal;

amplifying the phase modulated signal in accordance with the bias signal;

converting the lead phase signal to a pulse width signal having a constant amplitude and pulse widths proportional to a time-varying amplitude of the lead phase signal; and delaying a phase of the pulse width signal.

12. An amplifier circuit for amplifying a Radio Frequency (RF) signal having a phase modulated component and an amplitude modulated component, comprising:

a first path for amplifying the phase modulated component of the RF signal, wherein the first path includes an RF amplifier having an RF input coupled to an input of the amplifier circuit and an output coupled to an output of the amplifier circuit; and a second path for amplifying the amplitude modulated component of the RF signal, wherein the second path includes, an envelope detector having an input coupled to the input of the amplifier circuit, a delay compensation circuit having an input coupled to an output of the envelope detector, and an envelope amplifier having an input coupled to an output of the delay compensation circuit and an output coupled to a bias input of the RF amplifier, wherein the delay compensation circuit compensates for a time delay of the envelope amplifier.

13. The amplifier circuit of claim 12, wherein the delay compensation circuit includes an operational amplifier having an input coupled to the output of the envelope detector and an output coupled to the input of the envelope amplifier.

* * * * *